United States Patent
Jeon et al.

(10) Patent No.: US 8,661,317 B2
(45) Date of Patent: Feb. 25, 2014

(54) MEMORY DEVICE USING ERROR CORRECTING CODE AND SYSTEM THEREOF

(75) Inventors: Seong Hyun Jeon, Hwaseong-si (KR); Hoi Ju Chung, Yongin-si (KR)

(73) Assignee: Samsung Electronics Co., Ltd., Samsung-ro, Yeongtong-gu, Suwon-si, Gyeonggi-do (KR)

(*) Notice: Subject to any disclaimer, the term of this patent is extended or adjusted under 35 U.S.C. 154(b) by 260 days.

(21) Appl. No.: 13/339,716

(22) Filed: Dec. 29, 2011

(65) Prior Publication Data

US 2012/0173956 A1 Jul. 5, 2012

(30) Foreign Application Priority Data

Dec. 30, 2010 (KR) .................. 10-2010-0139501

(51) Int. Cl.
*H03M 13/00* (2006.01)
(52) U.S. Cl.
USPC .................. 714/763; 365/185.09; 365/185.33
(58) Field of Classification Search
USPC .................. 714/758, 763; 365/185.09, 185.33
See application file for complete search history.

(56) References Cited

U.S. PATENT DOCUMENTS

| | | | | |
|---|---|---|---|---|
| 5,671,229 A * | 9/1997 | Harari et al. .................. 714/710 |
| 7,146,555 B2 * | 12/2006 | Sasaki et al. .................. 714/755 |
| 7,178,067 B2 * | 2/2007 | Wuidart .................. 714/42 |
| 7,210,077 B2 * | 4/2007 | Brandenberger et al. ..... 714/708 |
| 7,308,637 B2 * | 12/2007 | Nakagawa et al. ........... 714/758 |
| 7,366,246 B2 * | 4/2008 | Walker et al. ................. 375/262 |
| 7,394,691 B2 * | 7/2008 | Shibata et al. ........... 365/185.09 |
| 7,673,222 B2 * | 3/2010 | Chiou ........................... 714/774 |
| 2010/0125774 A1 | 5/2010 | Arai |
| 2010/0223532 A1 | 9/2010 | Kang et al. |

FOREIGN PATENT DOCUMENTS

| | | |
|---|---|---|
| JP | 2010-123156 | 6/2010 |
| KR | 1020090127643 A | 12/2009 |
| KR | 1020100098969 A | 9/2010 |

* cited by examiner

*Primary Examiner* — Esaw Abraham
(74) *Attorney, Agent, or Firm* — Muir Patent Consulting, PLLC

(57) ABSTRACT

A memory device using error correcting code and a system including the same are provided. The memory system includes a memory device, and a storage block connected to the memory device. The memory device includes a normal cell region including a first plurality of memory cells for storing data bits, and an error correcting code (ECC) cell region including a second plurality of memory cells for storing first through mth sets of ECC bits. The storage block includes a third plurality of memory cells for storing first through nth sets of the ECC bits. Each memory cell of the first and second plurality of memory cells is a first type of memory cell and each memory cell of the third plurality of memory cells is a second type of memory cell different from the first type of memory cell.

20 Claims, 11 Drawing Sheets

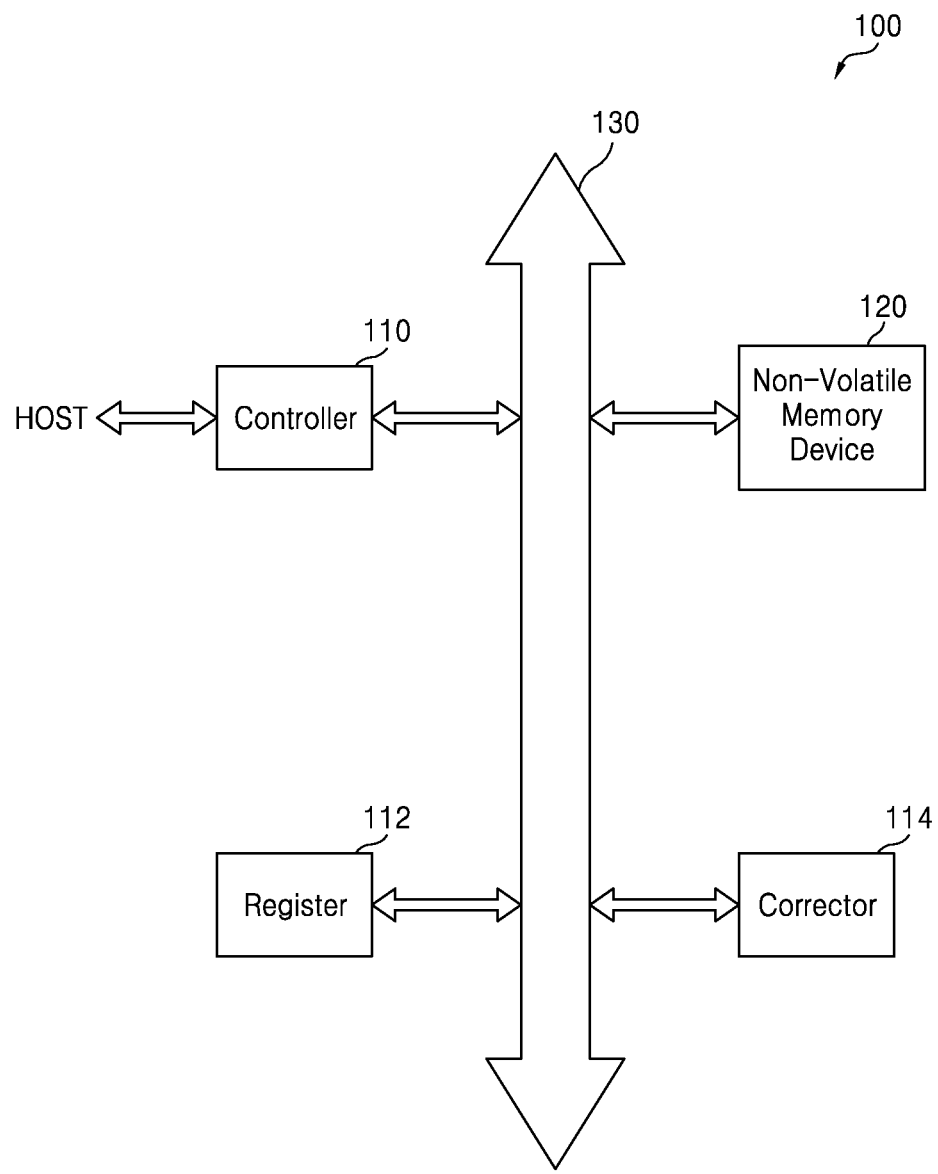

MEMORY DEVICE USING ERROR CORRECTING CODE AND SYSTEM THEREOF

CROSS-REFERENCE TO RELATED APPLICATIONS

This application claims the benefit of Korean Patent Application No. 10-2010-0139501, filed on Dec. 30, 2010, in the Korean Intellectual Property Office, the disclosure of which is incorporated herein in its entirety by reference.

BACKGROUND

Example embodiments relate to memory devices, and more particularly, to a memory device using error correcting code (ECC) and a system thereof Resistive memory devices, such as phase change random access memory (PRAM), magnetic RAM (MRAM), and resistive RAM (RRAM), exhibit high-integration capabilities of dynamic RAM (DRAM), non-volatile capabilities of flash memory, and high-speed operations of static RAM (SRAM).

If any one of memory cells included in such a memory device does not operate normally, the memory device cannot appropriately perform an operation thereof. To solve this problem, an error checking operation using ECC may be employed in such a memory device.

However, for example, when memory cells are reset in PRAM, data can be read from the PRAM a predetermined amount of time after the resetting.

SUMMARY

According to some embodiments of the present disclosure, there is provided a memory system including a memory device and a storage block connected to the memory device, and the memory device comprises a normal cell region including a first plurality of memory cells for storing data bits, and an error correcting code (ECC) cell region including a second plurality of memory cells for storing first through mth sets of ECC bits, and the storage block includes a third plurality of memory cells for storing first through nth sets of the ECC bits. Each memory cell of the first and second plurality of memory cells is a first type of memory cell and each memory cell of the third plurality of memory cells is a second type of memory cell different from the first type of memory cell.

The memory system including a corrector for correcting the data bits by using either one of the first through mth sets of the ECC bits stored in the storage block or one of the first through nth sets of the ECC bits stored in the ECC cell region.

The memory system including a multiplexer for receiving the first through nth sets of the ECC bits stored in the storage block and the first through mth sets of the ECC bits stored in the ECC cell region, and selecting and outputting either one of the first through nth sets of the ECC bits received from the storage block or one of the first through mth sets of the ECC bits received from the ECC cell region, and the corrector receives an output signal of the multiplexer.

The storage block includes an ECC register block for storing the first through nth sets of the ECC bits, and an address register block for storing addresses of the first through nth sets of the ECC bits.

The storage block includes a pointer for receiving addresses from the address register block in an order in which the addresses are received and instructing that the first through nth sets of the ECC bits based on the addresses be stored in the ECC register block.

According to some embodiments of the present disclosure, there is provided a memory device including a first storage region including a first plurality of memory cells for storing data bits, a second storage region including a second plurality of memory cells for storing first through mth sets of ECC bits, a third storage region including a third plurality of memory cells for storing first through nth sets of the ECC bits, and a corrector for correcting the data bits based on either one of the first through nth sets of the ECC bits stored in the third storage region or one of the first through mth sets of the ECC bits stored in the second storage region.

According to example embodiments, there is provided a method of error correcting for a memory device. In the method, data bits store in a first cell region including a first plurality of memory cells. First through mth sets of error correcting code (ECC) bits store in a second cell region including a second plurality of memory cells. First through nth sets of the error correcting code (ECC) bits and addresses of the first through nth sets of the ECC bits store in a third cell region including a third plurality of memory cells. The data bits are corrected based on either one of the first through mth sets of the ECC bits in the second cell region or one of the first through nth sets of the ECC bits in the third cell region. Each memory cell of the first and second plurality of memory cells is the same type of memory cell. Each memory cell of the third plurality of memory cells is the different type of memory cell from that of the first and second plurality of memory cells.

BRIEF DESCRIPTION OF THE DRAWINGS

Exemplary embodiments will be more clearly understood from the following detailed description taken in conjunction with the accompanying drawings in which:

FIG. 1A illustrates a memory system according to an example embodiment;

DETAILED DESCRIPTION OF THE EMBODIMENTS

Figure 1B:
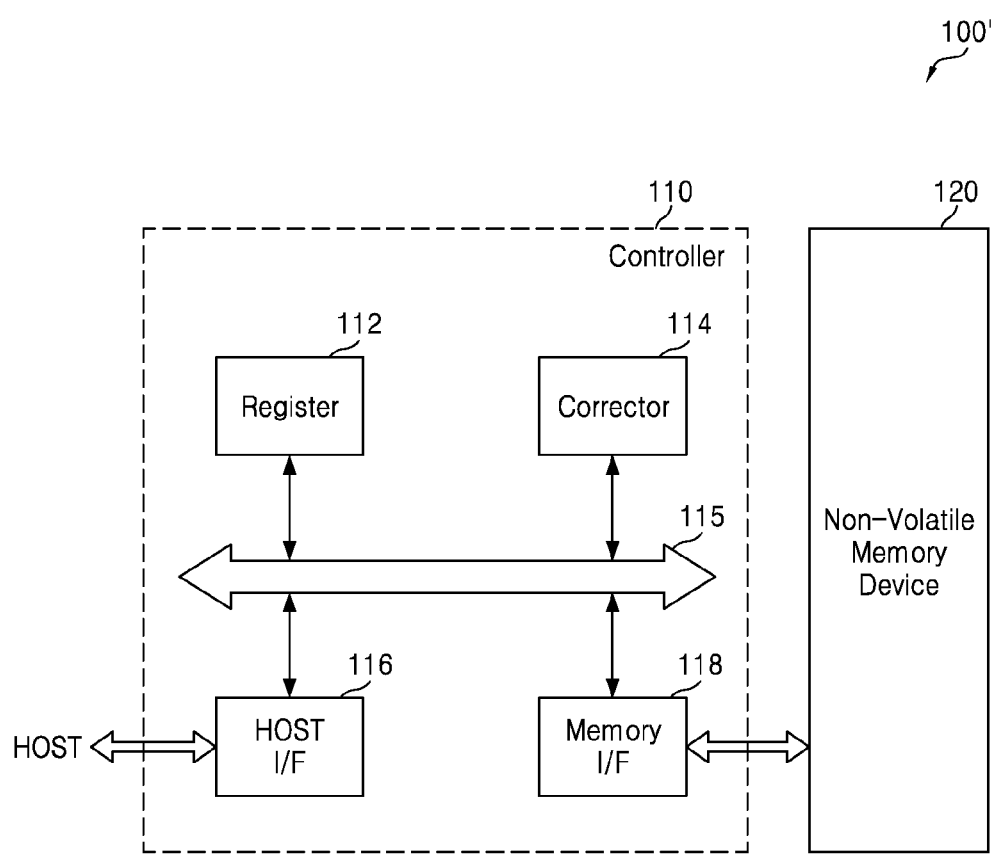
FIG. 1B illustrates a memory system according to another example embodiment.

Various example embodiments will be described more fully hereinafter with reference to the accompanying drawings, in which embodiments are shown. This disclosure may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present disclosure, and will not be interpreted in an idealized or overly formal sense unless expressly so defined herein.

Figure 1C:
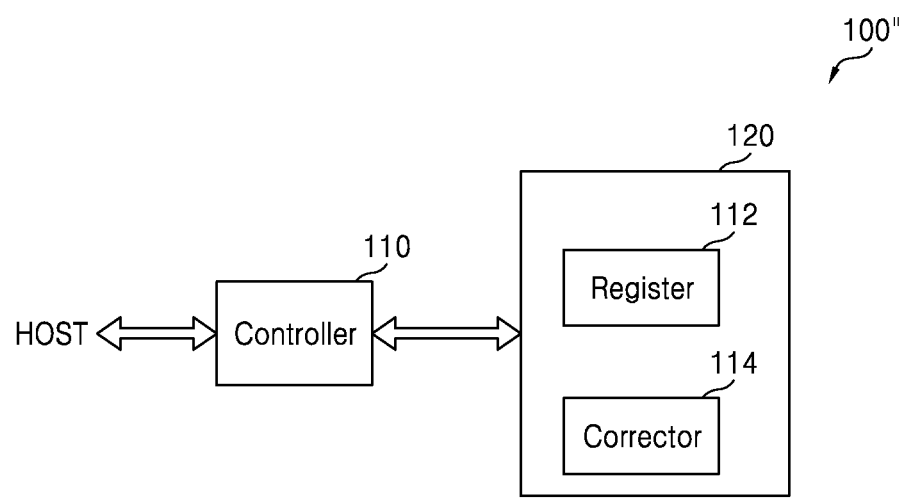
FIG. 1C illustrates a memory system according to another example embodiment.
Figure 2:
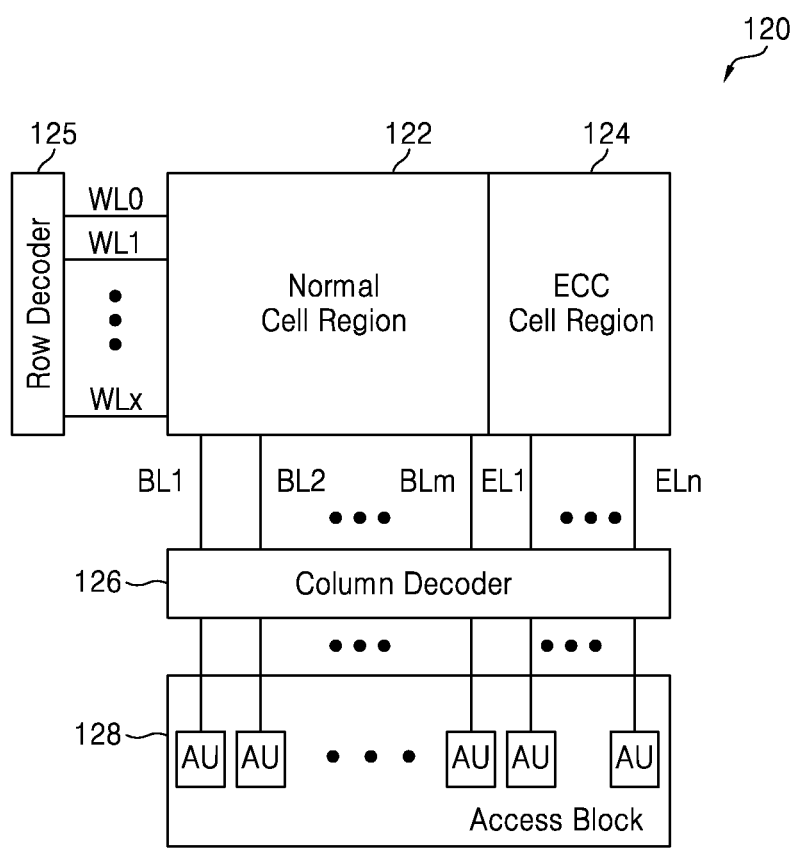
FIG. 2 specifically illustrates a non-volatile memory device illustrated in each of FIGS. 1A to 1C, according to an example embodiment.

FIG. 1A illustrates a memory system 100 according to an example embodiment. FIG. 1B illustrates a memory system 100' according to another example embodiment. FIG. 1C illustrates a memory system 100" according to another example embodiment. FIG. 2 specifically illustrates a non-volatile memory device 120 illustrated in each of FIGS. 1A to 1C, according to an example embodiment.

Referring to FIG. 1A, the memory system 100 may include the non-volatile memory device 120, a controller 110 for controlling the non-volatile memory device 120, a register 112, and a corrector 114.

A host is connected to the controller 110 and may thus exchange data with the non-volatile memory device 120.

The non-volatile memory device 120 may be connected to the controller 110, the register 112, and the corrector 114 via a bus 130. FIG. 2 specifically illustrates the non-volatile memory device 120.

Referring to FIG. 2, the non-volatile memory device 120 may include a normal cell region 122, an error correcting code (ECC) cell region 124, a row decoder 125, a column decoder 126, and an access block 128.

The normal cell region 122 includes a plurality of word lines WL0 to WLx, a plurality of bit lines BL1 to BLm, and a plurality of memory cells (or data cells). Here, 'x' and 'm' each denote a natural number. Each of the plurality of data cells may be connected to one of the plurality of word lines WL0 to WLx and one of the plurality of bit lines BL1 to BLm. The ECC cell region 124 includes a plurality of lines EL1 to ELn. Here, 'n' denotes a natural number. The normal cell region 122, and the ECC cell region 124 may be two-dimensionally or three-dimensionally embodied respectively.

The plurality of data cells may store data or data bits. In one embodiment, the plurality of data cells may store data in page units. For example, the page units may be 512 Bytes, 1024 Bytes, or 2046 Bytes. Alternatively, the page units may be multiples of 512 Bytes but the disclosure is not limited thereto. Each of the plurality of memory cells may be embodied as a non-volatile memory cell.

The non-volatile memory cell may be phase change random access memory (PRAM) but is not limited thereto and may be any of other various memories, e.g., electrically erasable programmable read-only memory (EEPROM), flash memory, magnetic RAM (RAM), spin-transfer torque MRAM, conductive bridging RAM (CBRAM), ferroelectric RAM (FeRAM), resistive RAM (RRAM or ReRAM), nanotube RRAM, polymer RAM (PoRAM), nano floating gate memory (NFGM), holographic memory, a molecular electronics memory device, or insulator resistance change memory.

The non-volatile memory cell may store one bit or a plurality of bits. For example, the non-volatile memory cell may be embodied as a single-level cell (SLC) or a multi-level cell (MLC).

The ECC cell region 124 may include a plurality of memory cells (ECC memory cells) that may store one or more ECC bits.

In one embodiment, the ECC memory cells may be embodied as pairs of memory cells. In this case, according to an example embodiment, each pair of memory cells may be referred to as a twin cell.

The row decoder 125 may select one of the plurality of word lines WL1 to WLx according to a row address received from an outside of the non-volatile memory device 120. The column decoder 126 may select at least one of the plurality of bit lines BL1 to BLm (e.g., 256 bits) and/or at least one of the plurality of lines EL1 to ELn (e.g., 9 bits) according to a column address received from the outside of the non-volatile memory device 120.

Thus, at least one data cell (e.g., 256 bits) may be selected in the normal cell region 122 and/or at least one ECC memory cell (e.g., 9 bits) may be selected in the ECC cell region 124 by using the row decoder 125 and the column decoder 126. For example, according to an embodiment, the ECC memory cells may be sequentially or simultaneously selected in the ECC cell region 124.

The column decoder 126 may be connected to or disconnected from the access block 128 via the plurality of bit lines BL1 to BLm included in the normal cell region 122 and the plurality of lines EL1 to ELn included in the ECC cell region 124, according to an input control signal (not shown). The access block 128 includes a plurality of access units AUs that are respectively connected to the plurality of bit lines BL1 to BLm and/or the plurality of lines EL1 to ELn.

Although not shown, for example, the access block 128 may include a sense amplifier and a write driver. The access block 128 may access the data cells in the normal cell region 122 and the ECC memory cells in the ECC cell region 124 when an access operation, e.g., a program operation, a write operation, a read operation, or an erase operation, is performed.

For example, if, during the write operation, the first word line WL0 is selected and one-page data is written to the data cells in the normal cell region 122, then the non-volatile memory device 100 may simultaneously or sequentially write the one-page data to the data cells by using the column decoder 126, based on an amount of current consumed. Here, the sequentially writing of the one-page data may be understood as applying write voltage to at least one bit line from among the bit lines BL1 to BLm.

Also, if, during the read operation, the first word line WL0 is selected and one-page data is read from the data cells in the normal cell region 122, then the non-volatile memory device 100 may simultaneously or sequentially read the one-page data from the data cells by using the column decoder 126, based on an amount of current consumed. Here, the sequentially reading of the one-page data may be understood as applying read voltage to at least one bit line from among the bit lines BL1 to BLm (e.g., 256 bits).

In the read operation, the access block 128 may apply the read voltage to all of bit lines from which data is to be read by using the column decoder 126, and a power supply circuit (not shown) may apply a ground voltage to all of the bit lines BL1 to BLm and the lines EL1 to ELn.

Data output from the normal cell region 122 is sensed and amplified by using a plurality of access units connected to the plurality of bit lines BL1 to BLm. ECC bits output from the ECC cell region 124 are sensed and amplified by using a plurality of access units connected to the plurality of lines EL1 to ELn.

The non-volatile memory device 120 may store information stored in the ECC cell region 124, e.g., ECC bits, and/or addresses, in the register 112. In this case, the information stored in the register 112 may be the same as the information stored in the ECC cell region 124. In one embodiment, the information stored recently in the ECC cell region 124 for a certain period of time is concurrently stored in the register 112.

Each of FIGS. 1A to 1C illustrates the register 112, but aspects of the disclosure are not limited thereto and a storage block including the register 112 may be used. The storage block may further include an SRAM or a DRAM. In one embodiment, the type of memory cell in the storage circuit is different from the type of memory cell used in the ECC cell region of the non-volatile memory device 120.

The corrector 114 may receive data from the non-volatile memory device 120, receive data from the normal cell region 122 and ECC bits either from the ECC cell region 124 or the register 112, and correct the data based on the received ECC bits. This is described in detail with reference to FIG. 3 below.

Referring to FIG. 1B, the memory system 100' according to another example embodiment includes a controller 110 and a non-volatile memory device 120.

In one embodiment, the controller 110 includes a register 112, a corrector 114, a host interface (I/F) 116 for interfacing with a host, and a memory I/F 118 for interfacing with the non-volatile memory device 120. The register 112, the corrector 114, the host I/F 116, and the memory I/F 118 are connected via a bus 115.

The memory system 100' is the same as the memory system 100 of FIG. 1A in terms of their structures and operations, except that the register 112 and the corrector 114 are included in the controller 110.

Referring to FIG. 1C, the memory system 100" according to another example embodiment includes a controller 110 and a non-volatile memory device 120.

The memory system 100" are the same as the memory system 100 of FIG. 1A and the memory system 100' of FIG. 1B in terms of their structures and operations, except that a register 112 and a corrector 114 are included in the non-volatile memory device 120.

Figure 3:
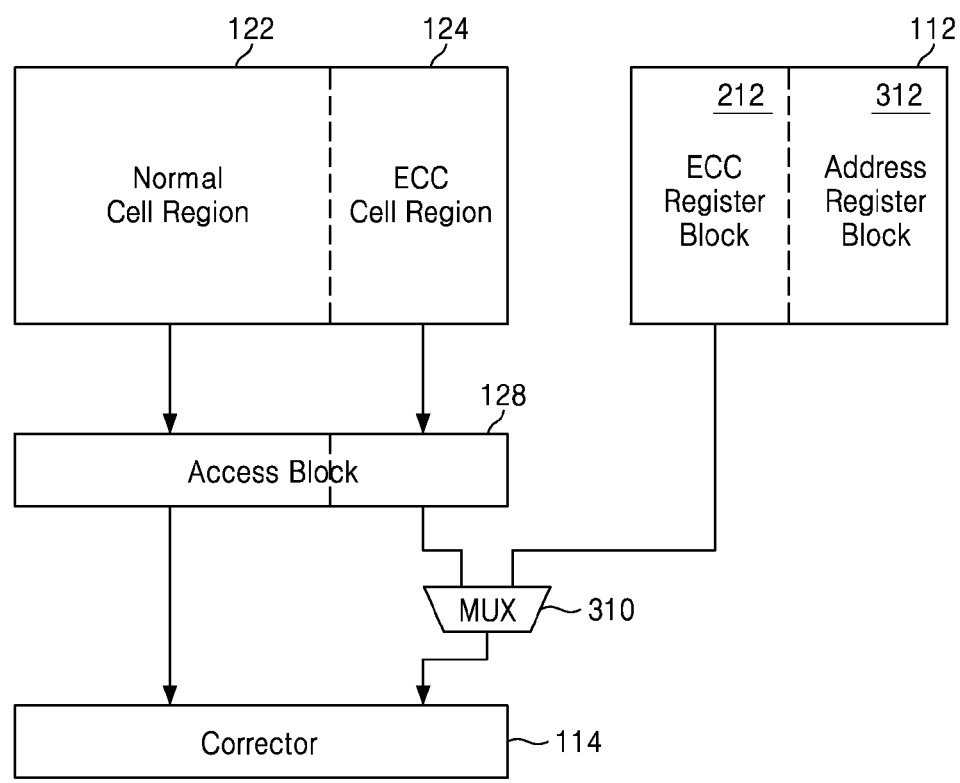
FIG. 3 is a conceptual diagram for explaining operations of the memory systems illustrated in FIGS. 1A to 1C, according to an example embodiment.

FIG. 3 is a conceptual diagram for explaining operations of the memory systems 100, 100', and 100" of FIGS. 1A to 1C, according to an embodiment. Referring to FIG. 3, for example, in the non-volatile memory device 120, data may be output from the normal cell region 122 by using the access block 128 and be then provided to the corrector 114. The normal cell region 122 is included in the non-volatile memory device 120. For example, the normal cell region 122 may include a plurality of memory cells, each cell of the plurality of memory cells being a first type of memory cell, such as a PRAM cell.

Also, in the non-volatile memory device 120, ECC bits may be output from the ECC cell region 124 by using the access block 128 and be then provided to a multiplexer 310. For example, the ECC cell region 124 may include a plurality of memory cells, each cell of the plurality of memory cells being a first type of memory cell, such as a PRAM cell. For example, the ECC bits may have first through mth sets, each set of the first through mth sets of ECC bits may have various numbers of bits (e.g., 9 bits). The value m may be a natural number.

When a type of each memory cell in the normal cell region 122 and ECC cell region 124 is a resistive type, such as a PRAM cell, it needs a certain amount of time for reading a certain logic level of data and ECC bits after a write operation.

For example, in the ECC cell region, when ECC bits are updated based on a write operation then the ECC bits may not be read correctly within a certain period of time after the ECC bits are updated.

In one embodiment, the register 112 may store information, e.g., ECC bits, and/or addresses, which is the same as information stored in the ECC cell region 124. For example, the information stored recently in the ECC cell region 124 for a certain period of time also, may be concurrently stored in the register 112 so that the system can read correctly from the register 112 without waiting after a write operation. The register 112 may include a plurality of memory cells, each cell of the plurality of memory cells may be a second type of memory cell (e.g., SRAM cell or DRAM cell) different from the first type of memory cell. For example, the ECC bits may have first through nth sets, each set of the first through nth sets of ECC bits may have various numbers of bits (e.g., 9 bits). The value n may be a natural number and smaller than m. In one embodiment, the plurality of memory cells in the register 112 are located separately from the plurality of memory cells in the ECC cell region 124.

More specifically, the register 112 may include an ECC register block 212 and an address register block 312. The ECC register block 212 may store ECC bits recently stored in the ECC cell region 124 for the certain period of time and may output the ECC bits to the multiplexer 310.

The address register block 312 stores addresses of the ECC bits stored in the ECC register block 212.

For example, when, during a write/read operation, an address is input to the address register block 312, the ECC bits may be stored in the ECC register block 212 based on the input address. The address may correspond to an address of the non-volatile memory device 120 where the ECC bits have been recently stored.

The multiplexer 310 may select either the ECC bits received from the ECC cell region 124 or the ECC bits received from the register 112, and provide the selected ECC bits to the corrector 114. The register 112 may function as a temporary memory, temporarily storing a copy of the sets of ECC bits most recently stored in the ECC region 124, for a predetermined period of time. In one embodiment the multiplexer 310 may select ECC bits in the register 112 when an input address is the same as an address stored in the register 112. In one embodiment, when the input address is stored in the register 112, this indicates that ECC bits of the input address have been stored recently and for less than a certain period of time, in ECC cell region 124. Alternatively, the multiplexer 310 may select ECC bits in the ECC cell region 124 when an input address is not stored in the register 112. When the input address is not stored in the register 112, but ECC bits of the input address are stored in the ECC cell region 124, this indicates that the ECC bits of the input address have not been stored recently in the ECC cell region 124, and have been stored longer than the certain period of time. After such a period of time, the ECC bits can be read correctly from the ECC cell region 124.

The multiplexer 310 may select the ECC bits based on a control signal (not shown) and provide the selected ECC bits to the corrector 114.

The corrector 114 may correct data received from the normal cell region 112, based on the ECC bits received from the multiplexer 310.

Figure 4:
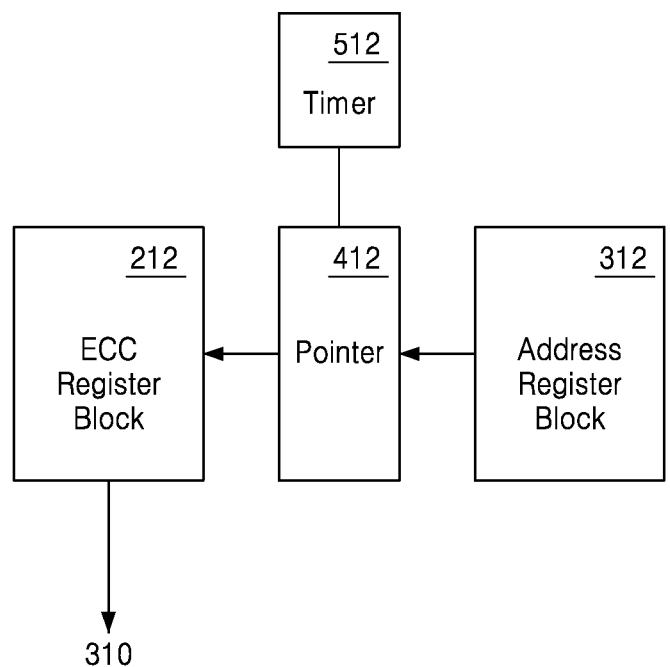
FIG. 4 is a block diagram illustrating an operation of a register illustrated in each of FIGS. 1A to 1C, according to an example embodiment.

FIG. 4 is a block diagram illustrating an operation of the register 112 illustrated in each of FIGS. 1A to 1C, according to an embodiment. Referring to FIG. 4, the register 112 includes an ECC register block 212, an address register block 312, a pointer 412, and a timer 512.

The ECC register block 212 and the address register block 312 are as described above with reference to FIG. 3.

The pointer 412 receives an address from the address register block 312, and instructs that ECC bits based on the address be stored in a particular storage location in the ECC register block 212.

For example, the pointer 412 may point out a blank storage location in the ECC register circuit 212 so that the ECC bits may be stored therein.

Alternatively, the pointer 412 may point out a storage location in the ECC register circuit 212, based on an order in which addresses are received.

The timer 512 may count down a predetermined amount of time so that the register 112 may erase information from the address register block 312 and/or the ECC register block 212 after the predetermined amount of time.

Also, the timer 512 may count down a reference number of times so that, if addresses are input to the register 112 the reference number of times or more during a write/read operation, then the register 112 may erase information from the address register block 312 and/or the ECC register block 212.

Figure 5:
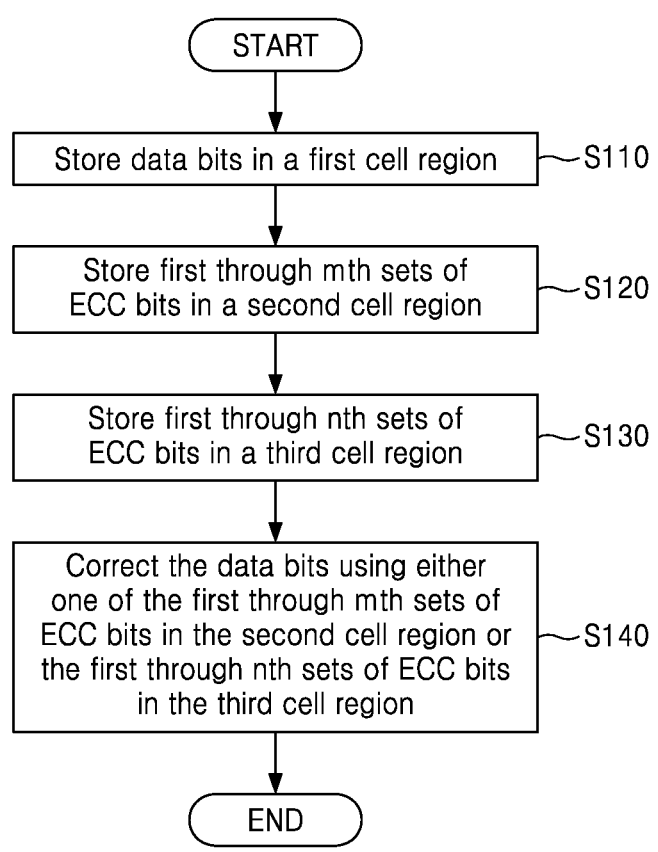
FIG. 5 is a flowchart illustrating an error correcting method according to an example embodiment.

FIG. 5 is a flowchart illustrating an error correcting method according to one embodiment. The method of FIG. 5 may be performed using one of the memory systems 100, 100', and 100" described above with reference to FIGS. 1A to 4. In operation S110, referring to FIGS. 1A to 5, data bits are stored in a first cell region included in the memory system 100, 100', or 100". The first cell region is included in the non-volatile memory device 120. For example, the first cell region may include a plurality of memory cells, each cell of the plurality of memory cells being a first type of memory cell, such as a PRAM cell.

In operation S120, first through mth sets of ECC bits are stored in a second cell region included in the memory system 100, 100', or 100". The second cell region is included in the non-volatile memory device 120. For example, the second cell region may include a plurality of memory cells, each cell of the plurality of memory cells being the first type of memory cell, such as a PRAM cell. For example, one set of the first through mth sets of ECC bits may have various numbers of bits (e.g., 9 bits) and m may be a natural number.

In operation S130, first through nth sets of ECC bits are stored in a third cell region included in the memory system 100, 100', or 100". The third cell region is included in the register 112. For example, the third cell region may include a plurality of memory cells, each cell of the plurality of memory cells being a second type of memory cell, such as an SRAM cell or a DRAM cell. For example, one set of the first through nth sets of ECC bits may have various numbers of bits (e.g., 9 bits). The value n may be a natural number and smaller than m.

In operation S140, errors in data stored in the first cell region are corrected using either one of the first through mth sets of ECC bits in the second cell region or one of the first through nth sets of ECC bits in the third cell region. The correcting of the errors may be performed by the corrector 114. For example, the corrector 114 may correct the errors in the data by using one of the first through nth sets of ECC bits received from the third cell region of the register 112.

Accordingly, in each of the memory systems 100, 100', and 100" according to various embodiments, ECC bits are separately stored in the register 112 so that each of the memory systems 100, 100', and 100" may correct errors in data stored therein at any time.

Figure 6:
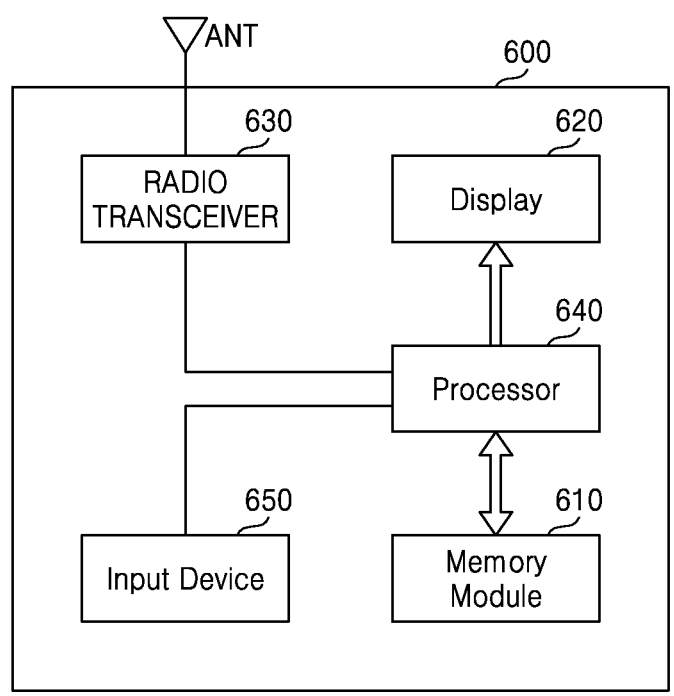
FIG. 6 is an electronic system according to an example embodiment.

FIG. 6 is an electronic system according to an example embodiment. Referring to FIG. 6, an electronic system 600 may be embodied in a cellular phone, a smart phone, or a wireless internet device.

The electronic system 600 includes the memory module 610 and the processor 640 controlling an operation of the memory module 610. The memory module 610 includes the non-volatile memory device 120, a register 112, and a corrector 114 shown in FIGS. 1A through 1C.

Data programmed in the memory module 610 may be displayed through a display 620 according to a control of the processor 640.

The radio transceiver 630 may transmit or receive a radio signal through an antenna ANT. For example, the radio transceiver 630 may convert a radio signal received through an antenna ANT into a signal which may be processed by the processor 640. Accordingly, the processor 640 may process a signal output from the radio transceiver 630 and store a processed signal in the memory module 610 or display the processed signal through the display 620.

Moreover, the radio transceiver 630 may convert a signal output from the processor 640 into a radio signal and output a converted radio signal to an external device through an antenna ANT.

An input device 650 is a device which may input a control signal for controlling an operation of the processor 640 or data to be processed by the processor 640. It may be embodied in a pointing device such as a touch pad and a computer mouse, a keypad or a keyboard.

The processor 640 may control an operation of the display 620 so that data output from the memory module 610, data output from the radio transceiver 630 or data output from the input device 650 may be displayed through the display 620. According to an example embodiment, the memory controller (not shown) controlling an operation of the memory module 610 may be embodied as a part of the processor 640 or as a chip separate from the processor 640. In this case, the memory controller may control an operation of the memory module 610 according to a control of the processor 640.

Figure 7:
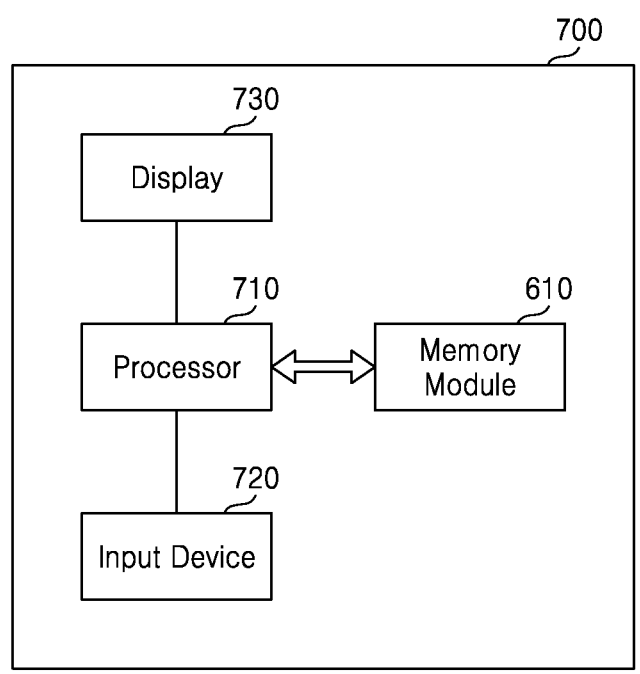
FIG. 7 is an electronic system according to another example embodiment.

FIG. 7 is an electronic system according to another example embodiment. Referring to FIG. 7, an electronic system 700 may be embodied in a personal computer (PC), a tablet PC, a net-book, an e-reader, a personal digital assistant (PDA), a portable multimedia player (PMP), a MP3 player or a MP4 player.

The electronic system 700 includes the memory module 610 and the processor 710 controlling a data processing operation of the memory module 610. The memory module 610 includes the non-volatile memory device 120, a register 112, and a corrector 114 shown in FIGS. 1A through 1C.

A processor 710 may display data stored in the memory module 610 through a display 730 according to data input through an input device 720. For example, the input device 720 may be embodied in a pointing device such as a touch pad or a computer mouse, a keypad or a keyboard.

According to an example embodiment, the memory controller (not shown) controlling an operation of the memory module 610 may be embodied as a part of the processor 710 or as a chip separate from the processor 710. In this case, the memory controller may control an operation of the memory module 610 according to a control of the processor 710.

Figure 8:
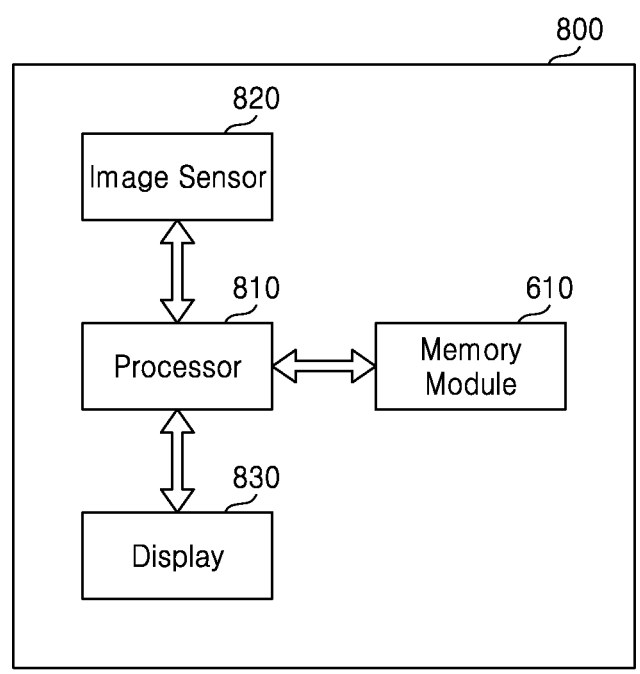
FIG. 8 is an electronic system according to still another example embodiment.

FIG. 8 is an electronic system according to still another example embodiment. Referring to FIG. 8, an electronic system 800 may be embodied in a digital camera or a digital camera-equipped cellular phone. The electronic system 800 includes the memory module 610 and the processor 810 controlling a data processing operation of the memory module 610. The memory module 610 includes the non-volatile memory device 120, a register 112, and a corrector 114 shown in FIGS. 1A through 1C.

An image sensor 820 of the electronic system 800 converts an optical image into digital signals. According to a control of the processor 810, the converted digital signals may be stored in the memory module 610 or displayed through a display 830.

In addition, data stored in the memory module 610 is displayed through the display 830 according to a control of the processor 810. According to an example embodiment, the memory controller (not shown) controlling an operation of the memory module 610 may be embodied as a part of the processor 810 or as a chip separate from the processor 810. In this case, the memory controller may control an operation of the memory module 610 according to a control of the processor 810.

Figure 9:
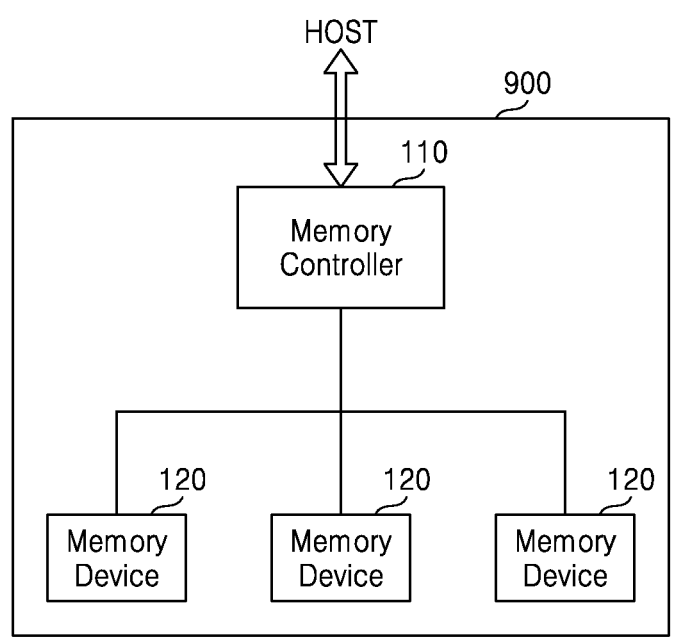
FIG. 9 is a memory system, which includes the memory device shown FIG. 1C, according to still another example embodiment.

FIG. 9 is a memory system, which includes the memory device shown FIG. 1C, according to still another example embodiment. Referring to FIG. 9, a memory system 900 may be embodied in a data processing device such as a solid state drive (SSD). The memory system 900 may include a plurality of memory devices 120, the memory controller 110 controlling a data processing operation of each of the plurality of memory devices 120.

As described above, a memory device and system according to an embodiment may correct errors in data stored therein by using an additional memory device at any time.

While the inventive concept has been particularly shown and described with reference to exemplary embodiments thereof, it will be understood that various changes in form and details may be made therein without departing from the spirit and scope of the following claims.

What is claimed is:

1. A memory system comprising:
a memory device; and
a storage block connected to the memory device,
wherein the memory device comprises:
a normal cell region including a first plurality of memory cells for storing data bits; and
an error correcting code (ECC) cell region including a second plurality of memory cells for storing first through mth sets of ECC bits, m is a natural number and greater than 1,
wherein the storage block includes a third plurality of memory cells for storing first through nth sets of the ECC bits, n is a natural number and greater than 1, and
wherein each memory cell of the first and second plurality of memory cells is a first type of memory cell and each memory cell of the third plurality of memory cells is a second type of memory cell different from the first type of memory cell.

2. The memory system of claim 1, further comprising a corrector for correcting the data bits by using either one of the first through mth sets of the ECC bits stored in the storage block or one of the first through nth sets of the ECC bits stored in the ECC cell region.

3. The memory system of claim 2, further comprising a multiplexer for receiving the first through nth sets of the ECC bits stored in the storage block and the first through mth sets of the ECC bits stored in the ECC cell region, and selecting and outputting either one of the first through nth sets of the ECC bits received from the storage block or one of the first through mth sets of the ECC bits received from the ECC cell region,
wherein the corrector receives an output signal of the multiplexer.

4. The memory system of claim 3, wherein the storage block comprises:
an ECC register block for storing the first through nth sets of the ECC bits; and
an address register block for storing addresses of the first through nth sets of the ECC bits.

5. The memory system of claim 4, wherein the storage block further comprises a pointer for receiving addresses from the address register block in an order in which the addresses are received and instructing that the first through nth sets of the ECC bits based on the addresses be stored in the ECC register block.

6. The memory system of claim 1, wherein n is smaller than m.

7. The memory system of claim 1, wherein the first type of memory cell is an NVM cell and the second type of memory cell is an SRAM cell.

8. A memory device comprising:
a first storage region including a first plurality of memory cells for storing data bits;
a second storage region including a second plurality of memory cells for storing first through mth sets of error correcting code (ECC) bits, m is a natural number and greater than 1;
a third storage region including a third plurality of memory cells for storing first through nth sets of the error correcting code (ECC) bits, n is a natural number and greater than 1; and
a corrector for correcting the data bits based on either one of the first through mth sets of the ECC bits stored in the second storage region or one of the first through nth sets of the ECC bits stored in the third storage region,
wherein the first through nth sets of the ECC bits in the third storage region are also stored in the second storage region.

9. The memory device of claim 8, wherein each cell of the first and second plurality of memory cells is a first type of memory cell and each cell of the third plurality of memory cells is a second type of memory cell different from the first type of memory cell.

10. The memory device of claim 9, wherein the first type of memory cell is an NVM cell and the second type of memory cell is an SRAM cell.

11. The memory device of claim 8, wherein the third storage region comprises:
an ECC register block for storing the first through nth sets of the ECC bits; and
an address register block for storing addresses of the first through nth sets of the ECC bits.

12. The memory device of claim 11, wherein the third storage region further comprises a pointer for receiving addresses from the address register block in an order in which the addresses are received and instructing that first through nth sets of the ECC bits based on the addresses be stored in the ECC register block.

13. The memory device of claim 8, further comprising a multiplexer for receiving the first through mth sets of the ECC bits stored in the second storage region and the first through nth sets of the ECC bits stored in the third storage region and selecting and outputting either one of the first through mth sets of the ECC bits received from the second storage region or one of the first through nth sets of the ECC bits received from the third storage region,
wherein the corrector receives an output signal of the multiplexer.

14. The memory device of claim 8, wherein the third storage region further includes fourth plurality of memory cells for storing addresses of the first through nth sets of the ECC bits, and wherein each cell of the fourth plurality of memory cells is the second type memory cell.

15. The memory device of claim 8, wherein each set of the first through mth sets of the ECC bits and the first through nth sets of the ECC bits include 1 or more ECC bits, and wherein the first through nth sets of the ECC bits are stored in the third storage region and in the second storage region.

16. A method of error correcting for a memory device comprising:
storing data bits in a first cell region including a first plurality of memory cells;
storing first through mth sets of error correcting code (ECC) bits in a second cell region including a second plurality of memory cells, wherein m is a natural number and greater than 1;
storing first through nth sets of the error correcting code (ECC) bits and addresses of the first through nth sets of the ECC bits in a third cell region including a third plurality of memory cells, wherein n is a natural number and greater than 1 but smaller than m; and
correcting the data bits based on either one of the first through mth sets of the ECC bits in the second cell region or one of the first through nth sets of the ECC bits in the third cell region,
wherein each memory cell of the first and second plurality of memory cells is the same type of memory cell, and
wherein each memory cell of the third plurality of memory cells is the different type of memory cell from that of the first and second plurality of memory cells.

17. The method of claim 16, further comprising:
comparing address stored in the third cell region to a received address; and
selecting either one of the first through mth sets of the ECC bits in the second cell region or one of the first through nth sets of the ECC bits in the third cell region based on the comparison.

18. The method of claim 17, further comprising selecting one of the first through nth sets of the ECC bits in the third cell region to correct data bits when the received address is stored in the third cell region.

19. The method of claim 16, wherein the first through nth sets of the ECC bits in the third cell region are also stored in the second cell region.

20. The method of claim 16, wherein each memory cell of the first and second plurality of memory cells is an NVM cell and each memory cell of the third plurality of memory cells is an SRAM cell.

* * * * *